US012658849B2

(12) United States Patent
Shrivastava et al.

(10) Patent No.: US 12,658,849 B2
(45) Date of Patent: Jun. 16, 2026

(54) HIGH PRECISION ON-CHIP RC OSCILLATOR

(71) Applicant: Northeastern University, Boston, MA (US)

(72) Inventors: Aatmesh Shrivastava, Weston, MA (US); Nikita Mirchandani, Allston, MA (US)

(73) Assignee: Northeastern University, Boston, MA (US)

( * ) Notice: Subject to any disclaimer, the term of this patent is extended or adjusted under 35 U.S.C. 154(b) by 0 days.

(21) Appl. No.: 18/825,640

(22) Filed: Sep. 5, 2024

(65) Prior Publication Data

US 2025/0088147 A1     Mar. 13, 2025

Related U.S. Application Data

(60) Provisional application No. 63/537,392, filed on Sep. 8, 2023.

(51) Int. Cl.
*H03K 3/037*     (2006.01)
*H03B 5/04*     (2006.01)
*H03B 5/24*     (2006.01)

(52) U.S. Cl.
CPC ................. *H03B 5/04* (2013.01); *H03B 5/24* (2013.01); *H03K 3/037* (2013.01)

(58) Field of Classification Search
CPC ..................... H03K 3/023; H03B 5/04
USPC .................... 331/66, 176, 111, 143
See application file for complete search history.

(56) References Cited

U.S. PATENT DOCUMENTS

| | | | | |
|---|---|---|---|---|
| 6,052,035 A * | 4/2000 | Nolan | .................... | H03K 3/011 |
| | | | | 331/74 |
| 6,356,161 B1 * | 3/2002 | Nolan | .................... | H03K 3/011 |
| | | | | 331/74 |
| 7,102,452 B1 * | 9/2006 | Holmes | .................... | H03B 5/04 |
| | | | | 331/111 |
| 7,164,325 B2 * | 1/2007 | Aparin | .................... | H03L 1/023 |
| | | | | 331/177 V |
| 7,461,285 B2 * | 12/2008 | Nervegna | ................. | G06F 1/04 |
| | | | | 713/500 |
| 2005/0285666 A1 * | 12/2005 | Garlapati | ................ | G05F 3/267 |
| | | | | 327/539 |
| 2006/0226922 A1 * | 10/2006 | Rajagopal | .............. | H03K 3/011 |
| | | | | 331/143 |
| 2007/0241833 A1 * | 10/2007 | Nervegna | .............. | H03K 3/354 |
| | | | | 331/176 |
| 2024/0162858 A1 * | 5/2024 | Wu | .......................... | H03B 5/24 |

* cited by examiner

*Primary Examiner* — Joseph Chang
(74) *Attorney, Agent, or Firm* — Foley Hoag LLP; Dana M. Gordon; Erik A. Huestis

(57) ABSTRACT

Methods, systems, and computer products are presented herein for generating a clock signal using an on-chip ultra-low power (ULP) RC oscillator. An on-chip ultra-low power (ULP) RC oscillator comprises a first comparator, a second comparator, and a flip flop. The first comparator comprises a first input electrically coupled to a first bias voltage generation circuit and a second input electrically coupled to a first capacitor circuit. Each of the first bias voltage and the second bias voltage directly varies with a thermal voltage. A flip-flop is electrically coupled to the first comparator and the second comparator. The flip-flop is configured to generate a clock signal based on the first and the second comparator output signals.

32 Claims, 12 Drawing Sheets

| | ISSCC-14 [20] | ISSCC-16 [21] | JSSC-16 [22] | This work |
|---|---|---|---|---|
| Process (nm) | 65 | 180 | 180 | 130 |
| Freq. (kHz) | 33 | 3 | 70.4 | 32.76 |
| Power(nW) | 190 | 4.7 | 110 | <50 |
| TC (ppm/°C) (Temp °C) | 38.2 (-20 to 90) | 14 (-25 to 85) | 34.3 (-40 to80) | 5.9 (-20 to 100) |
| Supply(%/V) | 0.09 | 45 | 0.75 | 0.17 |

FIG. 8

902 generating, by a first bias voltage generation circuit, a first bias voltage 904 generating, by a second bias voltage generation circuit, a second bias voltage 906 generating, by a first capacitor circuit, a first proportional to absolute temperature (PTAT) voltage 908 generating, by a second capacitor circuit, a second PTAT voltage 910 comparing, by a first comparator, the first bias voltage and the first PTAT voltage 912 generating, by the first comparator, a first comparator output signal based on the comparison of the first bias voltage and the first PTAT voltage 914 comparing, by a second comparator, the second bias voltage and the second PTAT voltage 916 generating, by the second comparator, a second comparator output signal based on the comparison of the second bias voltage and the second PTAT voltage; wherein each of the first bias voltage and the second bias voltage directly varies with a thermal voltage 918 generating, by a flip-flop electrically coupled to the first comparator and the second comparator, a clock signal based on the first and the second comparator output signals

FIG. 9

HIGH PRECISION ON-CHIP RC OSCILLATOR

CROSS REFERENCE TO RELATED APPLICATIONS

This application claims the benefit of priority to U.S. Provisional Patent Application No. 63/537,392, filed Sep. 8, 2023; which is hereby incorporated by reference herein in its entirety.

BACKGROUND

Field of the Disclosed Subject Matter

The disclosed subject matter relates analog circuits for RC oscillators. Particularly, the present disclosed subject matter is directed to analog circuits for On-Chip RC Oscillators that may be used in implementing real-time clocks for Internet-of-Things (IoT) devices.

Description of Related Art

Internet-of-things (IoT) is a way of networking sensors which are placed on everyday physical objects to perform meaningful sensing and communication. Since its conception, IoT has been touted as the next wave of computing with exponential growth prospects. However, the growth outlook of IoT has recently tempered when compared to the astronomical growth predicted a few years ago due to the technological challenges that must be overcome.

A report from Mckinsey Inc. identifies power consumption and operation of IoT devices from harvested energy as the fundamental technological challenge that must be overcome to realize the full potential and growth of IoT [1]. IoT can realize its predicted growth outlook if IoT devices can be seamlessly deployed without the need for maintenance. IoT devices need to be autonomous, particularly energy autonomous, where a system can meet its energy requirements either through energy harvesting or through batteries that can last for a very long time. However, system power consumption is high and energy available from harvesting is low which presents a significant challenge in achieving energy autonomy for IoT devices.

To address these challenges, researchers have been developing ultra-low power and energy harvesting circuit and system design techniques. A typical approach may be to make increasingly more energy available for the system through efficient and Ultra Low Power (ULP) energy harvesting. This may reduce the power consumption of existing circuits and system architecture and it may overcome the energy gap [2]. These ULP design techniques may lead to an overhaul of existing circuit and system architecture.

At circuit level, new architectures tailored for ULP operation are being proposed where even fundamental circuit components may be re-developed. At system level, several system design techniques may be used to further reduce the power consumption. Duty-cycling an IoT device may be one of the popular system power saving techniques. In duty-cycling, the system may be operated in idle mode with extremely low power consumption for a long duration and in active mode with higher power consumption for short duration [3]. Such long idle time may help the system to regain the lost energy in active mode through energy harvesting. Thus, average power consumption may be brought down. A wake-up driven system architecture may be another popular choice. Such an architecture may be where IoT sensors, such as activity monitor, acoustic monitor, etc., are woken up in the event of an external stimulus and become active and perform processing and communication [4]. Yet another popular technique may be to use ultra-low power wake-up radios [5]. In the wake-up radio based IoT devices, an RF wakeup signal may be provided for the system to become active when there is a need to gather data.

IoT devices may spend a large portion of their time in inactive or idle mode to save power. A typical operation of a ULP system may constitute a short burst of activity followed by a long idle time. The short burst of activity may consume higher power, whereas the power consumption in idle mode may be relatively small [10]. Spending a large time in the idle mode may save energy and can help with recharging the storage capacitor of energy harvesting ULP systems from low energy ambient harvesting sources. To maximize idle time while remaining functional in a larger interconnected IoT network, these systems may require precise clock to synchronize and wake-up the system at regular intervals. A real-time clock (RTC) utilizing an ULP oscillator may often be used for this purpose.

The design space for RTC oscillators for IoT may primarily explore four parameters, including area, cost, power, and stability of the oscillator. Optimization of all four parameters may be necessary. From power consumption point of view, the total power consumption of a duty-cycled system may be determined by the power consumption of the RTC. To reduce the power consumption and to increase the life-time of the system, the power consumption of the RTC may need to be reduced which drives the need for its ULP operation. The size of an IoT device and cost may also be determined by the RTC. An implementation of RTC using a crystal oscillator may be higher cost and may consume a greater area when compared to an on-chip implementation, which may be gaining traction. Finally, the importance of stability for RTC device may not be understated since the precise wake-up and synchronization of IoTs saves high-power synchronization cost.

The conventional approach for implementing an ultra-low power (ULP) real-time clock (RTC) has been to use an off-chip 32 kHz crystal oscillator, which involves off-chip passive components. The use of an off-chip crystal resonator, a possible bias resistor, and capacitors can increase the cost and size of IoT devices. Thus, an on-chip ULP 32 kHz oscillator may be desirable for IoT devices as it may eliminate off-chip passives, decreasing size and cost. However, on-chip oscillators may not exhibit stability close to that of a crystal oscillator. The use of crystal oscillators for IoT devices may largely be dictated by the need to wake up and synchronize precise intervals, something that may be guaranteed through high stability oscillators. Hence, there is a need for an on-chip oscillator that can achieve a stability comparable to that of a crystal oscillator.

Therefore, to fully realize the potential of IoTs, it may be essential to develop ultra-low power (ULP) real-time clock (RTC) systems and techniques including one or more on-chip oscillators that address the challenges of power consumption, cost, area, and stability.

SUMMARY OF THE DISCLOSED SUBJECT MATTER

The purpose and advantages of the disclosed subject matter will be set forth in and apparent from the description that follows, as well as will be learned by practice of the disclosed subject matter. Additional advantages of the disclosed subject matter will be realized and attained by the methods and systems particularly pointed out in the written description and claims hereof, as well as from the appended drawings.

To achieve these and other advantages and in accordance with the purpose of the disclosed subject matter, as embodied and broadly described, the disclosed subject matter includes an on-chip ultra-low power (ULP) RC oscillator comprising a first comparator, a second comparator, and a flip flop. The first comparator comprises a first input electrically coupled to a first bias voltage generation circuit and a second input electrically coupled to a first capacitor circuit. The first bias voltage generation circuit is configured to generate a first bias voltage, and the first capacitor circuit is configured to generate a first proportional to absolute temperature (PTAT) voltage. The first comparator is configured to compare the first bias voltage and the first PTAT voltage, and to generate a first comparator output signal based on the comparison. The second comparator comprises a first input electrically coupled to a second bias voltage generation circuit and a second input electrically coupled to a second capacitor circuit. The second bias voltage generation circuit is configured to generate a second bias voltage, and the second capacitor circuit can be configured to generate a second PTAT voltage. The second comparator is configured to compare the second bias voltage and the second PTAT voltage, and to generate a second comparator output signal based on the comparison. Each of the first bias voltage and the second bias voltage directly varies with a thermal voltage. A flip-flop is electrically coupled to the first comparator and the second comparator. The flip-flop is configured to generate a clock signal based on the first and the second comparator output signals.

The first and the second bias voltage generation circuits can each comprise a proportional to absolute temperature (PTAT) current source electrically coupled in series with a resistor. The PTAT current source can be configured to produce a current and provide the current to the resistor. The PTAT current source can be biased sub-threshold. The PTAT current source can be configured to produce a current that is proportional to the thermal voltage. The PTAT current source can comprise a plurality of PMOS transistors and a plurality of NMOS transistors. The current may be characterized by $nV_t \ln(M)/R_B$, and wherein $V_t$ is the thermal voltage, M is a beta parameter of one of the plurality of PMOS transistors, $R_B$ is a bias resistance, and n is a scaling factor. The resistor can comprise a poly-resistor. The resistor may be characterized by a bias resistance, $R_B$. The first and the second capacitor circuits can each comprise a proportional to absolute temperature (PTAT) current source electrically coupled in series to an NMOS transistor, a capacitor, and a temperature compensation circuit. The PTAT current source can be configured to produce a current and provide the current to the NMOS transistor and the capacitor. The PTAT current source can be biased sub-threshold. The PTAT current source can be configured to produce a current that is proportional to the thermal voltage. The NMOS transistor can be electrically coupled at its source to the capacitor, and the NMOS transistor can be electrically coupled at its gate to the flip-flop. The capacitor can be a Metal-Insulator-Metal (MIM) capacitor. The temperature compensation circuit can comprise a second order current source. The second order current source can be configured to produce an additional current and provide the additional current to the NMOS transistor and the capacitor. The additional current can directly vary with an operating temperature of the on-chip ULP RC oscillator. The clock signal can comprise comprises a frequency stability of about 5.9 ppm/° C. The thermal voltage can vary with an operating temperature of the on-chip ULP RC oscillator. The flip-flop can be a RS flip-flop. The RS flip-flop can be electrically coupled to the first comparator and the second comparator. A first input of the RS flip-flop can be configured to receive the first comparator output signal. A second input of the RS flip-flop can be configured to receive the second comparator output signal. A first output of the RS flip-flop can be configured provide a first offset correction to the first comparator. A second output of the RS flip-flop can be configured to be provide a second offset correction to the second comparator. The RS flip-flop can be electrically coupled to the first capacitor circuit and the second capacitor circuit. The first output of the RS flip-flop can be configured to drive the second capacitor circuit. The second output of the RS flip-flop can be configured to drive the first capacitor circuit.

The disclosed subject matter also includes a method of generating a clock signal. A first bias voltage is generated by a first bias voltage generation circuit. A second bias voltage is generated by a second bias voltage generation circuit. A first proportional to absolute temperature (PTAT) voltage is generated by a first capacitor circuit. A second PTAT voltage is generated by a second capacitor circuit. The first bias voltage and the first PTAT voltage is compared by the first comparator. A first comparator output signal based on the comparison of the first bias voltage and the first PTAT voltage is generated by the first comparator. A second comparator output signal based on the comparison of the second bias voltage and the second PTAT voltage is generated by the second comparator. The first bias voltage and the second bias voltage directly vary with thermal voltage. A clock signal based on the first and the second comparator output signals is generated by a flip-flop electrically coupled to the first comparator and the second comparator.

The first and the second bias voltage generation circuits can each comprise a proportional to absolute temperature (PTAT) current source electrically coupled in series with a resistor. A current may be produced by the PTAT current source. The current may be provided by the PTAT current source to a resistor. The first and the second bias voltage generation circuits may each comprise a proportional to absolute temperature (PTAT) current source electrically coupled in series with a resistor. The PTAT current source can be biased sub-threshold. A current that is proportional to the thermal voltage may be produced by the current source. The PTAT current source can comprise a plurality of PMOS transistors and a plurality of NMOS transistors. The current may be characterized by $nV_t \ln(M)/R_B$, and wherein $V_t$ is the thermal voltage, M is a beta parameter of one of the plurality of PMOS transistors, $R_B$ is a bias resistance, and n is a scaling factor. The resistor can comprise a poly-resistor, and wherein the resistor is characterized by a bias resistance, $R_B$. The first and the second capacitor circuits can each comprise a proportional to absolute temperature (PTAT) current source electrically coupled in series to an NMOS transistor, a capacitor, and a temperature compensation circuit. A current can be produced by the PTAT current source, The current can be provided by the PTAT current source to the NMOS transistors and the capacitor. The PTAT current source can be biased subthreshold. A current that is proportional to the thermal voltage can be produced by the PTAT current source. The NMOS transistor can be electrically coupled at its source to the capacitor, and the NMOS transistor can be electrically coupled at its gate to the flip-flop. The capacitor can be a Metal-Insulator-Metal (MIM) capacitor. The temperature compensation circuit can comprise a second order current source. An additional current can be produced by the second order current source. The additional current can be provided by the second order current source to the NMOS transistor and the capacitor. The additional current can directly vary with an operating temperature. The clock signal can comprise a frequency stability of about 5.9 ppm/° C. The thermal voltage can vary with an operating temperature. The flip-flop can be a RS flip-flop. The RS flip-flop can be electrically coupled to the first comparator and the second comparator. The first comparator signal can be received by a first input of the RS flip-flop. The second comparator signal can be received by a second input of the RS flip-flop. A first offset correction can be provided by a first output of the RS flip-flop to the first comparator. A second offset correction can be provided by a second output of the RS flip-flop to the second comparator. The RS flip-flop can be electrically coupled to the first capacitor circuit and the second capacitor circuit. The second capacitor circuit can be driven by a first output of the RS flip-flop. The first capacitor circuit can be driven by a second output of the RS flip-flop.

It is to be understood that both the foregoing general description and the following detailed description are exemplary and are intended to provide further explanation of the disclosed subject matter claimed.

The accompanying drawings, which are incorporated in and constitute part of this specification, are included to illustrate and provide a further understanding of the method and system of the disclosed subject matter. Together with the description, the drawings serve to explain the principles of the disclosed subject matter.

BRIEF DESCRIPTION OF THE DRAWINGS

A detailed description of various aspects, features, and embodiments of the subject matter described herein is provided with reference to the accompanying drawings, which are briefly described below. The drawings are illustrative and are not necessarily drawn to scale, with some components and features being exaggerated for clarity. The drawings illustrate various aspects and features of the present subject matter and may illustrate one or more embodiment(s) or example(s) of the present subject matter in whole or in part.

FIG. 4A depicts a PTAT current source with an integrated bias structure. FIG. 4B depicts an analog circuit of a relaxation oscillator using a PTAT current source as shown in FIG. 4A.

FIG. 6A shows a plot of the variation of frequency as a function of temperature for 50 points of the Monte-Carlo simulation with mismatch. FIG. 6B shows a histogram of frequency variation in parts per million (ppm) across 50 points of the Monte-Carlo simulation.

FIG. 7A shows a histogram of the frequency variation of the relaxation oscillator with process variation. FIG. 7B shows a histogram of the relaxation oscillator's frequency stability across temperature variation from −20 to 100° C.

FIG. 8 is a table showing a comparison of a relaxation oscillator according to various embodiments of the present disclosure with other oscillators.

FIG. 9 is a flow chart depicting a method for generating a clock signal.

DETAILED DESCRIPTION

Figure 1:
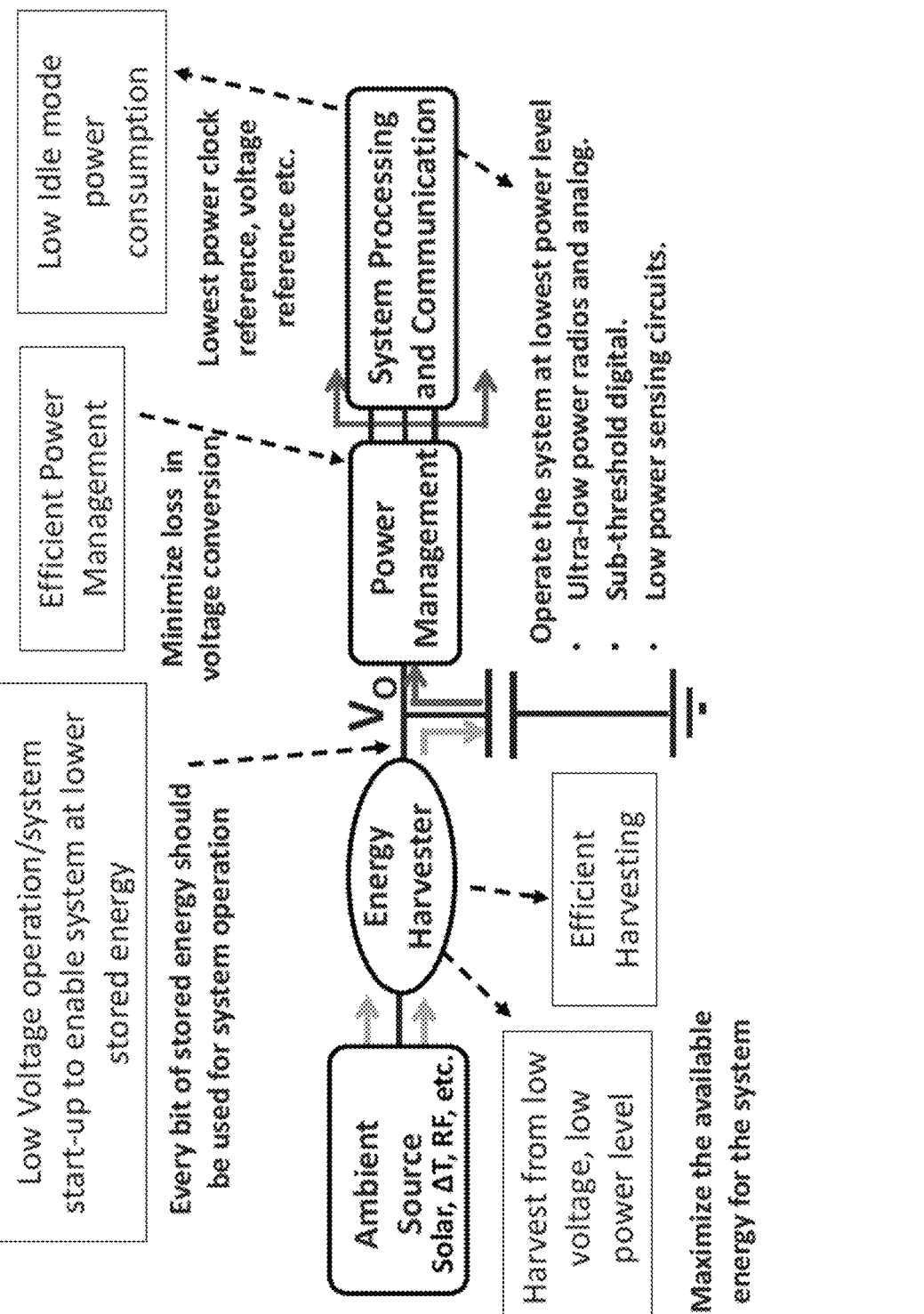
FIG. 1 illustrates the flow of energy in an energy harvesting system, from initial harvesting by a harvester to consumption, and identifies potential areas for optimization according to various embodiments of the present disclosure.

Reference will now be made in detail to exemplary embodiments of the disclosed subject matter, an example of which is illustrated in the accompanying drawings. The method and corresponding steps of the disclosed subject matter will be described in conjunction with the detailed description of the system.

The design principles for developing infrastructure circuits for IoT devices are outlined and discussed in [2]. The infrastructure circuits included energy harvesting, power delivery, reference, and clock generation circuits. It was shown that the lifetime of an IoT device can be improved by at least 4× and at most 70× when compared to [3] by properly optimizing infrastructure circuits in the context of system operation. The design techniques involved optimization at the critical points of the flow of energy in an energy harvesting IoT device.

A crystal oscillator (XTAL) provides a very precise output frequency (~5-20 ppm/° C.) that is not affected by process or power supply variation by using an off-chip electromechanical crystal resonator. Although off-chip components can increase the cost and volume of the system, XTALs are still considered for ULP systems that require precise timing for wake-up or synchronization for a system in an IoT network. The power consumption of the crystal oscillator used in ULP systems must be very small. Work on the design of 32 KHz XTAL oscillators showed power consumption in the single digit nW range [12], [13], and [9] making it possible to use them for ULP applications. Power consumption of crystal oscillators can be reduced by lowering the amplitude of oscillation by operating at lower voltages. Low power electronic watches use this technique to operate crystal oscillator circuits in the subthreshold or weak inversion region of operation of the transistors [14]. The crystal oscillator circuit proposed in [15] achieved a power consumption of 22 nW operating with a power supply (VDD) around 600 mV. A delay locked loop (DLL)-based XTAL achieved a power consumption of 5.58 nW. It also achieved a lower swing to reduce the power consumption in the XTAL's effective series resistance (ESR). However, to reduce the power consumption and to maintain low swing for oscillation, it needed two power supplies and two grounds. It also required a large area for its implementation. A self-charging XTAL design reduced the power consumption to 1.89 nW [12]. In this circuit, XI and XO were operated in a self-charging loop, where both XI and XO were charged based on the operating phase of the oscillator using only the parasitic load capacitors. In conventional designs, the input of the oscillator XI may be obtained from XO as a filtered output through the high-quality crystal resonator. The spectrum of XI may contain only the resonance frequency of the oscillator. However, the self-charging scheme may charge XI to maintain the oscillation. The circuit used for charging XI can introduce additional frequency components in XI, which may degrade the spectrum of the oscillator.

A low-power 32 kHz crystal oscillator circuit was introduced in [9], which consumed 1.5 nW of power and had an area of 0.0625 mm$^2$. The circuit had over 26% lower power compared to [12] and over 3.7×lower power and 8×lower area compared to [13]. The crystal circuit was operated at 0.3 V VDD, with a duty-cycling technique. The circuit in [9] was a low power, low area crystal oscillator circuit. It applied lower voltage design in conjunction with a duty-cycling technique to achieve lower power suitable for ULP devices in IoT networks. Despite the improvements made on a crystal oscillator circuit, particularly the single digit nW power consumption, the device size and cost remained large.

Researchers have investigated on-chip oscillators as a means for providing stable clock for integrated circuits (IC) for some time. Some of the approaches for implementing on-chip oscillator may include an RC relaxation oscillator, a gate-leakage based oscillator, LC oscillators, and a precision CMOS relaxation oscillator, which is presented in [16]. The precision CMOS relaxation oscillator achieves a temperature stability of 23 ppm/° C., but its power consumption is 45 W for a 14 MHz clock. Further, this oscillator showed a power supply variation of 16 ppm/mV. A 150 nW, 100 kHz on-chip oscillator achieved a temperature stability of 5 ppm/° C. for a temperature range of 20° C.-40° C. and 14 ppm/° C. for a temperature range of 20° C.-70° C. [23]. The power supply variation of this oscillator was 0.1%/mV. The temperature stability and the power consumption of the oscillator may make it suitable for ULP applications, but it may require a very controlled power supply. On-chip oscillators, using the gate leakage current, have been proposed in [17]-[19]. These designs employed calibration for temperature compensation and achieved, at best, a temperature stability of 32 ppm/° C. The power supply variation of these on-chip oscillators was 0.42%/mV. Further, these oscillators can operate only at very low frequency (e.g., 0.1-10 Hz) due to the low magnitude of gate leakage current. A paper from Texas Instruments (TI) showed stability of 38.2 ppm/° C. for a 33 kHz relaxation oscillator with a power consumption of 190 nW [20]. These designs achieved a long-term stability of 4 ppm. Its voltage variation was 0.09%. A resistive frequency locked loop (FLL) achieved a temperature stability of 34.3 ppm/° C. It consumed 110 nW power and achieved a long-term stability of 7 ppm. It exhibited high line sensitivity of 0.75%/V. A 4.7 nW, 2.9 kHz switched capacitor-based timer achieved a temperature stability of 13.8 ppm/° C. However, its frequency of operation was 2.9 kHz which is smaller than needed for RTC applications. It also exhibited lower long-term stability of 65 ppm and lower power supply variation of 0.48%. Another work realized a relaxation oscillator based RTC with a power consumption of 2.2 pW [24]. However, this oscillator had lower stability of 3400 ppm/° C., which was not suitable for IoT wake-up events.

Prior works either have higher power consumption or lower overall stability than what is presented herein. Stability similar or better than an off-chip crystal oscillator has not been exhibited by an on-chip oscillator except in the work reported in [23]. However, the designs in this work achieved high stability only for a small temperature range. They also exhibited poor power supply variation.

FIG. 1 shows the flow of energy in an energy harvesting IoT device. In an IoT device, energy may be harvested from ambient sources such as solar cells, TEG, RF, etc. The harvested energy can be stored in a storage capacitor in the form of voltage $V_O$. This stored energy may then be used by power management circuit to provide various voltages, $V_{DDS}$. In particular, the stored energy in the capacitor may be used to generate voltages, $V_{DDS}$, which can be used for powering different communication and processing blocks of the IoT device. Improvements in low power sub-threshold design, as well as low power radios for communication, may reduce the power consumption to increase the lifetime of IoT devices. However, a significant improvement in such lifetime may be achieved by optimizing at the critical points of energy flow as shown in FIG. 1.

For example, the lifetime of an IoT device can be improved by optimizing its power management and energy harvesting systems. To maximize the IoT device's operational life, the system may harvest from low voltage and power levels to extract every possible bit of energy available. Thus, a very efficient energy harvester may be used. The voltage on the storage capacitor may indicate the amount of energy available for the IoT device, and the system may only turn on if $V_O$ reaches a set threshold level which indicates a minimum energy level for the IoT device to operate.

As another example, to further extend the device's lifetime, the operating voltage may be lowered. The voltage $V_O$ may be used to generate various VDDs for the IoT device, and minimizing power losses during this voltage conversion may be important. Given that IoT devices may spend a large percentage of their time in idle mode, the total power consumption of the system may often be determined by the idle mode. To increase the lifetime of the IoT device, the power consumption in the idle mode may need to be reduced. Described herein is a real-time clocking solution for IoT devices. The real-time clocking solution includes circuits that address the issues related to increasing the lifetime of IoT devices, described herein, thereby extending the lifetime of the IoT devices in which they are implemented.

Various embodiments disclosed herein relate to a highly stable on-chip relaxation oscillator for IoT devices. On-chip oscillators disclosed herein can have less than 5 ppm/° C. stability rivaling quartz crystal oscillator stability. On-chip oscillators disclosed herein can be implemented in a standard CMOS 130 nm process technology.

Features of the disclosed subject matter can include: 1) an on-chip clock source using precision and capacitors, 2) temperature compensation and negative supply for suppressing leakage, and 3) power versus long term stability trade-off.

Advantages of the disclosed subject matter can include high on-chip stability and ultra-low power usage.

Potential uses of the disclosed subject matter include generation of timing solutions for synchronization and IoT timing solutions for synchronization.

Performance advantages of the disclosed subject matter include lower power usage, higher stability, and on-chip implementation.

An on-chip stable clock source for implementing an RTC for IoT devices can significantly improve the state of the art. Typically, crystal oscillators may be required for RTC functionality in IoT devices, however, these oscillators may be large-off chip components, making it challenging to integrate them into compact devices, such as an IoT device with a small form factor footprint of 1 mm². The disclosed subject matter may significantly reduce the cost and size of such IoT devices. In addition, the disclosed subject matter may be applied to the general semiconductors/chip research and further lead to wide adoption of techniques in the industry. For example, the disclosed subject matter may help mobile device manufacturers to reduce device sizes of their electronic products.

Figure 2:
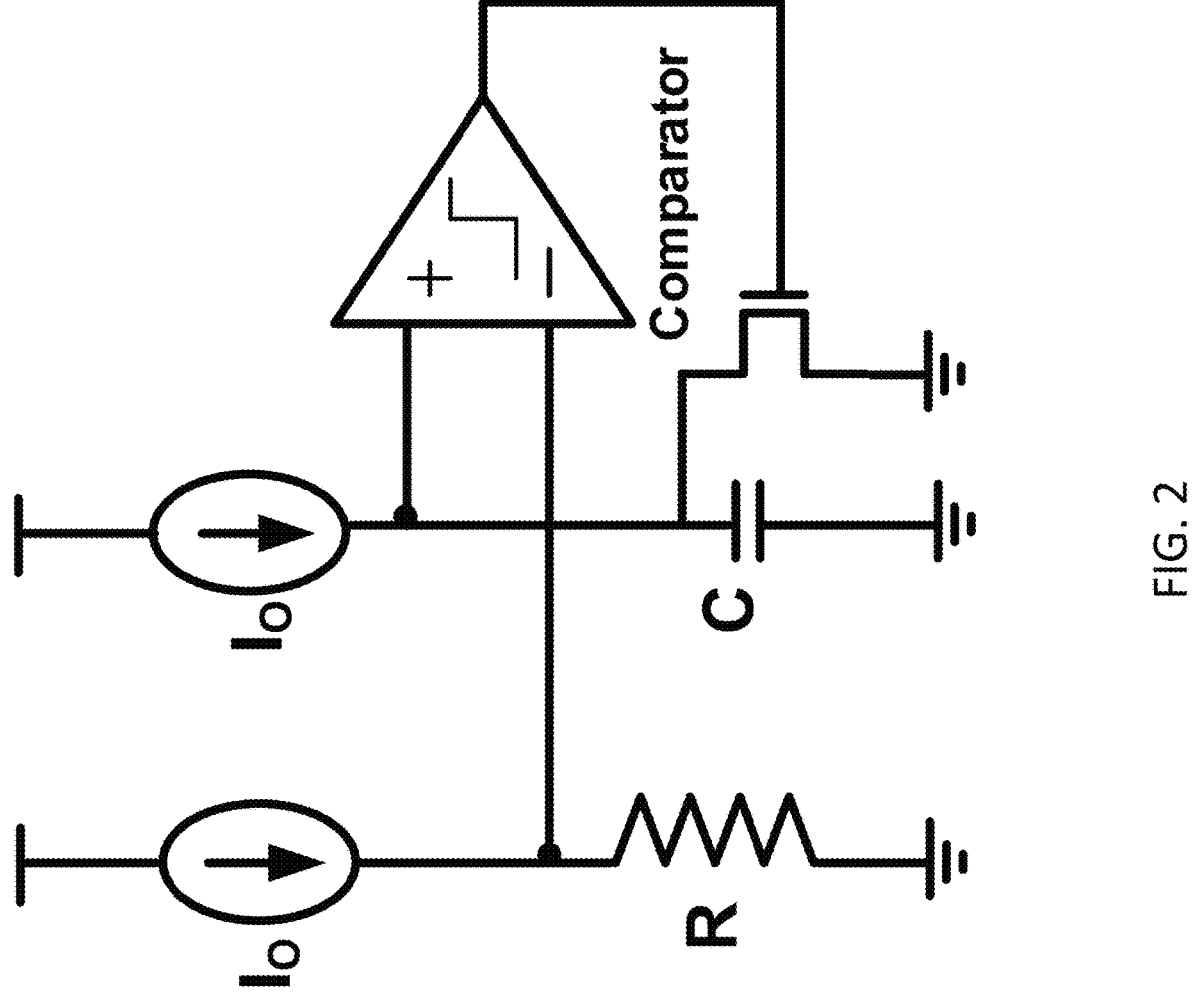
FIG. 2 depicts an analog circuit corresponding to a typical RC relaxation oscillator according to various embodiments of the present disclosure.

A compensated on-chip relaxation oscillator can be used to implement the RTC. RC Relaxation oscillators may typically be preferred to implement stable on-chip oscillators because they show much lower dependence on process and voltage variations. FIG. 2 depicts an analog circuit corresponding to a typical RC relaxation oscillator. The negative terminal of a comparator may be biased using a resistor to a voltage $I_O R$. The capacitor may be charged to the bias voltage. Once the capacitor reaches the bias voltage $I_O R$, the comparator output may go high (i.e., to a logical high value) and clear the stored voltage on the capacitor. This may put the circuit in a loop which repeats periodically with frequency of oscillation given by f=1/RC, assuming an ideal comparator. If the comparator's non-idealities are ignored, it may be seen that the frequency of oscillation may be independent of the bias current $I_O$, which can vary with process and temperature. However, in a practical design several factors may play a significant role in determining the stability of a relaxation oscillator. These non-idealities may be presented to scope out the need for research and innovation in RC relaxation oscillators.

As may be evident from the expression of frequency of the relaxation oscillator, the value of frequency may depend on resistor and capacitor value. The value of resistor and capacitor may vary due to process and temperature variation. To address the process and temperature variation, earlier designs used an off-chip precision resistor and capacitor to realize the relaxation oscillator. However, using an off-chip precision resistor and capacitor increased the size and cost of the solution, and in many ways, it was not very different from using an off-chip crystal oscillator.

Temperature and Process Variation of Resistor and Capacitor

Figure 3:
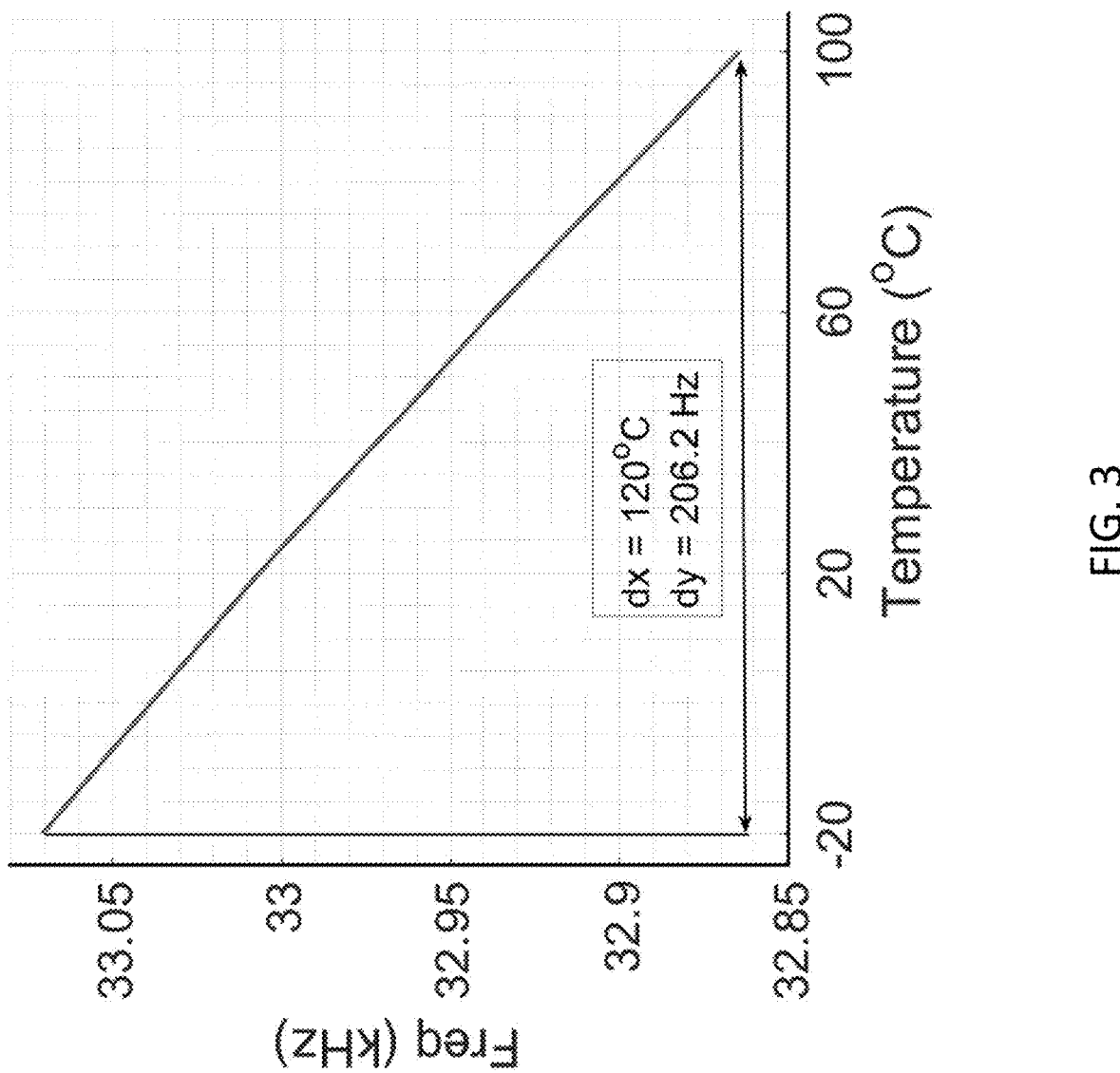
FIG. 3 shows a plot of the variation of frequency as a function of temperature for an on-chip relaxation oscillator according to various embodiments of the present disclosure.

The on-chip realization of a relaxation oscillator can have variation due to process and temperature. To address these variations, on-chip poly resistors and MIM capacitors may be used. Both on-chip components may have a relatively small temperature coefficient. FIG. 3 shows a plot of the variation of frequency as a function of temperature for an on-chip relaxation oscillator. In particular, FIG. 3 shows the simulation result of an on-chip 32 kHz relaxation oscillator realized using poly resistor and MIM capacitor. The small temperature variation of both resistor and capacitor resulted in a very small overall temperature variation. The circuit achieved a stability performance of 53 ppm/° C.

Comparator Offset

The temperature stability of a relaxation oscillator may be significantly impacted by the offset of the comparator used. The offset of a comparator refers to the relatively small voltage difference that is required between the input terminals of the comparator to cause a change in its output state. This offset may introduce an additional voltage component. In the presence of an offset, a comparator may trigger only after the voltage on the capacitor crosses $I_O R + V_{OFF}$, where $V_{OFF}$ can be positive or negative. This may introduce $V_{OFF}$ as an additional variable to the frequency function. $V_{OFF}$ may be a random variable which can change with process, temperature, bias condition, etc. Offset voltage can affect the accuracy of the comparator, leading to errors in applications requiring precise threshold detection. Consequently, in various embodiments, an offset voltage should not be introduced in a precision oscillator such as a relaxation oscillator. A method to compensate the offset in the comparator is described herein. This method may be used to eliminate the comparator offset. The on-chip 32 kHz relaxation oscillator used to produce the simulation results shown in FIG. 3 used the offset compensation technique, as described herein.

Comparator Delay

The period of the relaxation oscillator may be governed by the time to charge the capacitor. Once the oscillator reaches the $I_O R$, then the comparator may go high (i.e., to a logical high value), which clears the charge on capacitor using a switch. There may be a finite delay associated with the time of the comparator going high until the clearance of charge on the capacitor. This delay may be dependent on the process, temperature and voltage variation. In various embodiments, this delay should not contribute significantly to the overall period of the comparator, because it can cause additional variation which cannot be compensated. To address this issue, high performance comparators may be used. These high performance comparators may have a very small delay compared to the overall period. An ultra-low power high performance comparator may be used such that high performance can be achieved by reducing the parasitic delay components. The on-chip 32 kHz relaxation oscillator used to produce the simulation results shown in FIG. 3 used the offset compensation technique and a high performance comparator to reduce the comparator delay, as described herein. Thus, the results in FIG. 3 show that the comparator delay had insignificant impact on the performance of the comparator.

Relaxation Oscillator

Figure 4A:
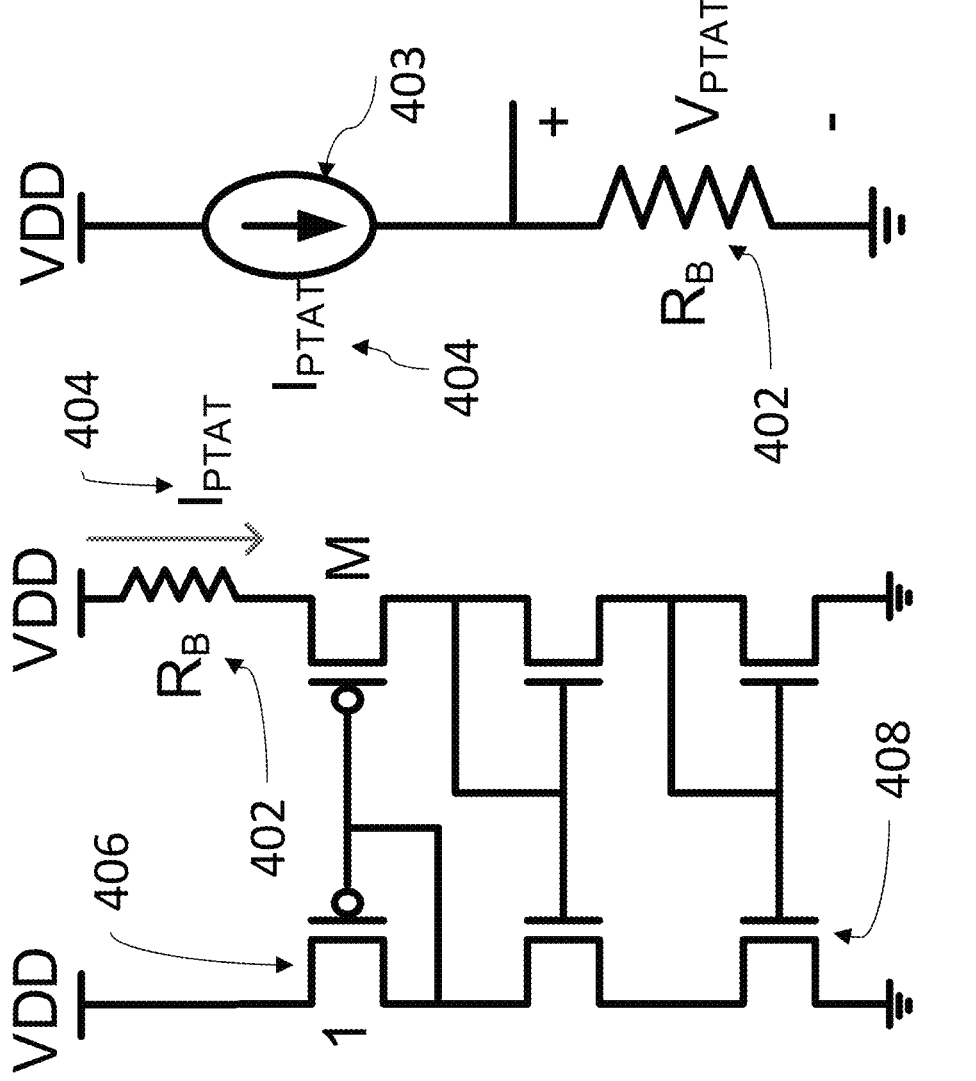
FIGS. 4A and 4B depict an analog circuit of a relaxation oscillator using offset compensation and temperature compensation using a PTAT current reference according to various embodiments of the present disclosure.
Figure 4B:
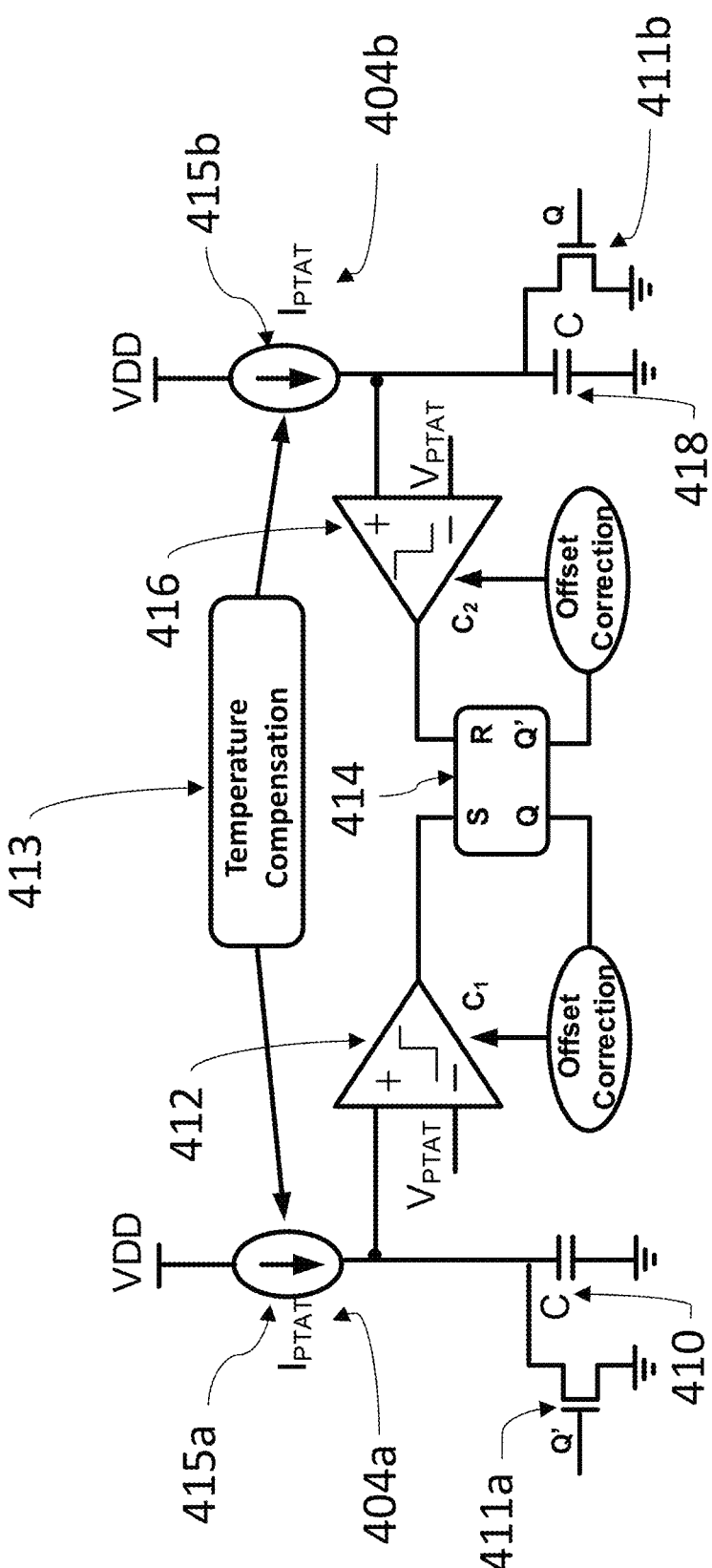

A relaxation oscillator which overcomes the challenges, as discussed herein, is provided. In addition, a temperature compensation scheme, which provides a relatively high temperature stability, is provided. FIGS. 4A and 4B depict an analog circuit corresponding to a relaxation oscillator using offset compensation and temperature compensation using a PTAT current reference according to various embodiments of the present disclosure. FIG. 4A depicts a PTAT current source with an integrated bias structure. The relaxation oscillator can use a PTAT current source that generates a current, $I_{PTAT}$, as shown in FIG. 4A. A PTAT current is a type of electrical current whose magnitude increases proportionally with absolute temperature. Achieving a PTAT current may involve using specific circuit designs that can take advantage of the temperature-dependent characteristics of semiconductor devices. The PTAT current source 403 may be electrically connected in series with a resistor 402, for example, a poly-resistor, forming a bias voltage generation circuit. The PTAT current source 403 may be used to generate a bias voltage that compensates for temperature variations. The PTAT current source 403 may provide a PTAT current $I_{PTAT}$ 404 to the resistor 402 to generate a voltage that varies with temperature. This current source may be biased sub-threshold and may produce a current with a value defined by $nV_t \ln(M)/R_B$ [2], where $V_t$ is the thermal voltage, M is a beta parameter of a transistor (e.g., a PMOS transistor as shown), $R_B$ is a bias resistance of a resistor, such as resistor 402, and n is a scaling factor. The beta parameter of, for example, a PMOS transistor may be the current gain of the transistor and may reflect how effectively the gate-to-source voltage controls the drain current. The thermal voltage may be used to generate a bias voltage $I_{PTAT}*R_B$ that directly varies with thermal voltage. The thermal voltage may vary with an operating temperature of an oscillator as described herein. This technique may provide enhanced insulation from process variations typical in sub-threshold designs.

The PTAT current source may comprise multiple p-channel metal-oxide-semiconductor (PMOS) transistors 406 and multiple n-type metal-oxide-semiconductor (NMOS) transistors 408.

FIG. 4B depicts an analog circuit corresponding to a relaxation oscillator using a PTAT current source as shown in FIG. 4A. In particular, FIG. 4B shows the complete architecture of a relaxation oscillator. A first PTAT current source 415a may be electrically connected in series to a first capacitor C 410, an NMOS transistor 411a, and a temperature compensation circuit 413, collectively forming a first capacitor circuit. The source of the NMOS transistor 411a may be electrically connected between the PTAT current source 415a and the first capacitor C 410, as shown, and gate of the NMOS transistor 411a may be electrically connected to the RS flip flop 414, as shown. The first capacitor circuit may generate a PTAT voltage. The first PTAT current reference $I_{PTAT}$ 404a may be used to charge the first capacitor C 410. The first capacitor C 410 may be a Metal-Insulator-Metal (MIM) capacitor. The first PTAT current reference $I_{PTAT}$ 404a may also be used to provide a current to the source of the NMOS transistor 411a electrically connected to the first capacitor C 410, as shown. One of inputs of the first comparator C1 412 may be electrically connected with the first capacitor circuit, as shown. Another input of the first comparator C1 412 may be electrically coupled to a first bias voltage generation circuit, such as a bias voltage generation circuit similar to the one shown in FIG. 4A. The first comparator C1 412 may compare the bias voltage produced by the first bias voltage generation circuit and a PTAT voltage $V_{PTAT}$ generated by the first capacitor circuit. The first capacitor C 410 may be charged to voltage $V_{PTAT}$, which may cause the first comparator C1 412 output to go high (i.e., to a logical high value) and set the RS flip-flop 414 to high (i.e., make the SET input of the RS flip-flop to a logical high value), which may measure the oscillator's high time (i.e., a logical high value of the clock). After the first comparator C1 412 voltage has gone high, the low time of the clock (i.e., a logical low value of the clock) may be determined by enabling the second comparator C2 416 and charging the second capacitor C2 418 in the same manner as described with regards to the first comparator C1 412 and the first capacitor C 410.

A second PTAT current source 415b may be electrically connected in series to a second capacitor C 418, an NMOS transistor 411b, and a temperature compensation circuit 413, collectively forming a second capacitor circuit. The source of the NMOS transistor 411b may be electrically connected between the PTAT current source 415b and the second capacitor C 418, as shown, and gate of the NMOS transistor 411b may be electrically connected to the RS flip flop 414, as shown. The second capacitor circuit may generate a PTAT voltage. The second PTAT current reference $I_{PTAT}$ 404b may be used to charge the second capacitor C 418. The second capacitor C 418 may be a Metal-Insulator-Metal (MIM) capacitor. The second PTAT current reference $I_{PTAT}$ 404b may also be used to provide a current to the source of the NMOS transistor 411b electrically connected to the second capacitor C 418, as shown. One of inputs of the second comparator C2 416 may be electrically connected with the second capacitor circuit. Another input of the second comparator C2 416 may be electrically coupled to a second bias voltage generation circuit, such as the bias voltage generation circuit similar to the one shown in FIG. 4A. The second comparator C2 416 may compare the bias voltage produced by the second bias voltage generation circuit and a PTAT voltage $V_{PTAT}$ generated by the second capacitor circuit. During this time, the offset of the first comparator C1 412 may be cancelled. When the voltage on the second comparator C2 416 crosses $V_{PTAT}$, the second comparator C2 416 output may go high (i.e., to a logical high value) and reset the RS flip-flop 414 to low (i.e., setting the SET input of the RS flip-flop to a logical low value), which may measure the oscillator's low time (i.e., a logical low value of the clock). This event may also trigger the next cycle and the first comparator C1 412 allowing the oscillator's high time to be recalculated. In this 'ping-pong' fashion, the offsets of both comparators 412 and 416 may be continuously compensated. This compensation may effectively remove offset variations, which can occur due to process and temperature changes, ensuring that they do not affect the clock period.

The RS flip-flop 414 may be electrically connected to both comparators 412 and 416. More specifically, a first input of the RS flip-flop may receive the first comparator's 412 output signal, while a second input of the RS flip-flop may receive the second comparator's 416 output signal. Outputs of the RS flip-flop may provide an offset correction to each of the comparators 412 and 416. Outputs of the RS flip-flop may drive each of the capacitor circuits electrically connected to the comparators 412 and 416. The RS flip-flop may generate a clock signal based on the outputs of the first and second comparator output signals. The clock signal may comprise a frequency stability of about 5.9 ppm/° C.

Figure 5:
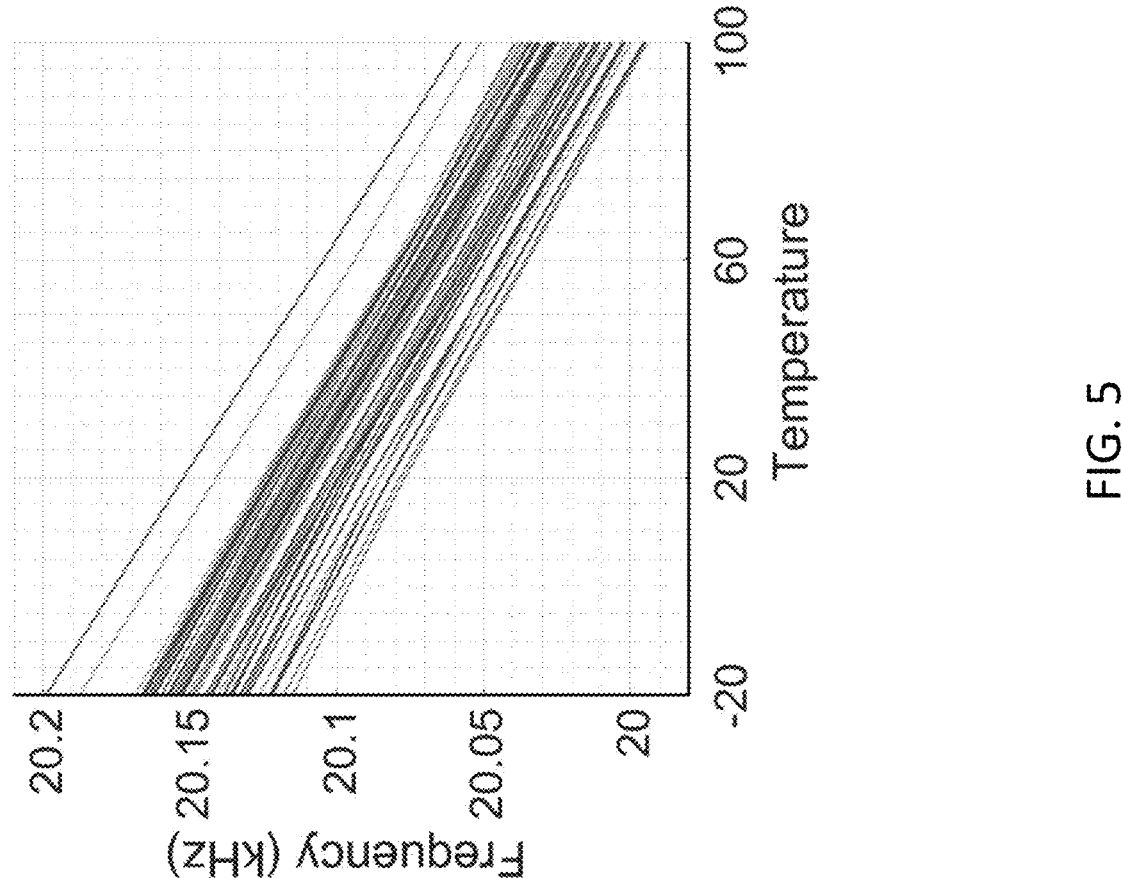
FIG. 5 shows a plot of a Monte-Carlo simulation related to design mismatch variation and the resulting frequency variation as function of temperature for the on-chip relaxation oscillator of FIGS. 4A and 4B according to various embodiments of the present disclosure.

A design of a relaxation oscillator was simulated to assess mismatch variation, and its resulting frequency variation. The results were analyzed, over a temperature range from −20° C. to 100° C. FIG. 5 shows a plot of a Monte-Carlo simulation related to design mismatch variation and the resulting frequency variation as function of temperature for the on-chip relaxation oscillator of FIGS. 4A and 4B. In particular, FIG. 5 shows the results of a 50-point Monte-Carlo simulation focusing on design mismatch analysis. A 50-point simulation was used to prevent a large simulation time. The results, as shown in FIG. 5, point to an elimination of the impact of comparator offset on the frequency variation. Additionally, the simulation indicated that the comparator delay did not significantly affect performance and a frequency stability of 53 ppm/° C. was achieved. The frequency stability was primarily determined by the temperature coefficients of resistor and capacitor.

Frequency Compensation

Figure 6A:
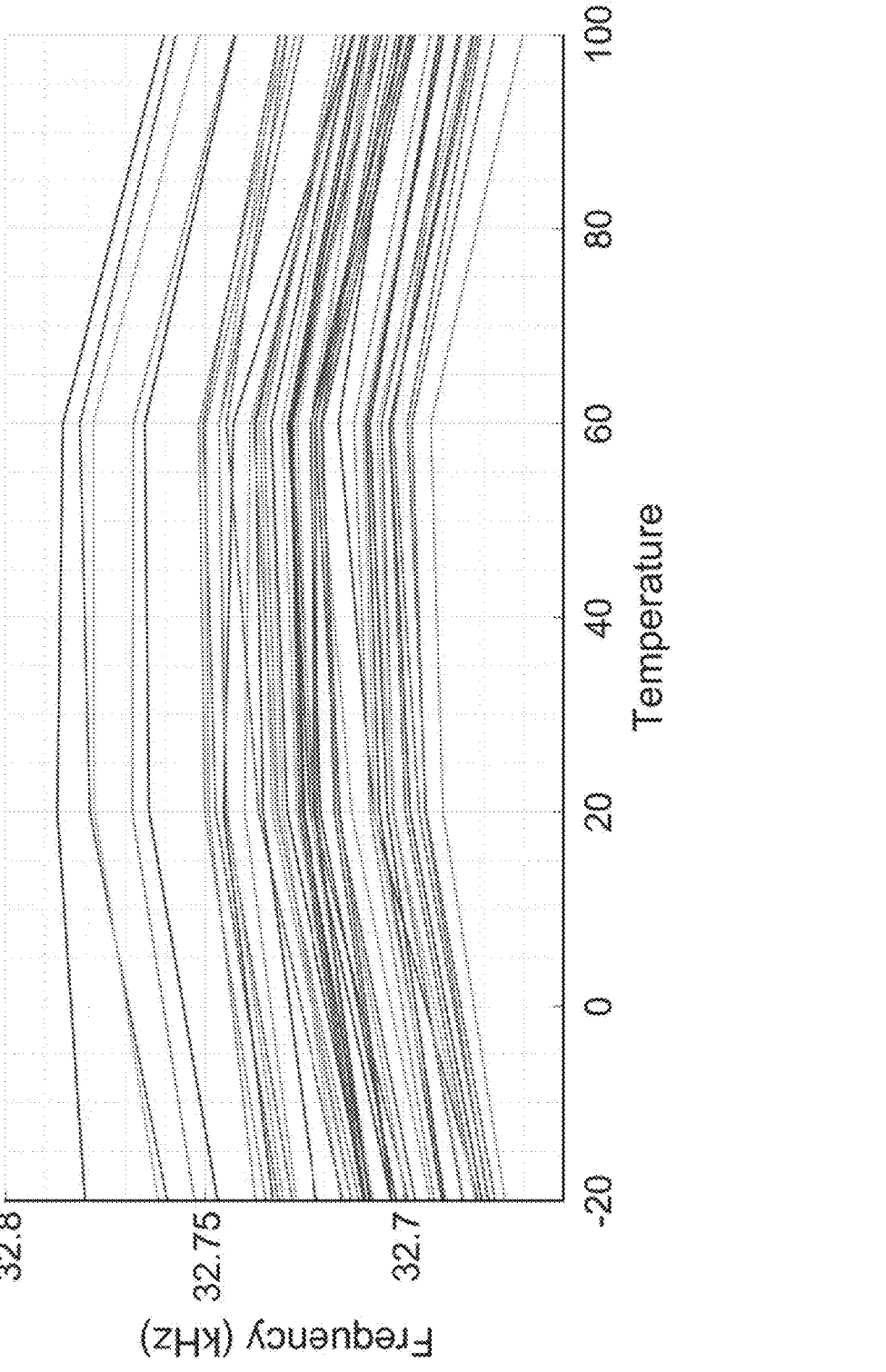
FIGS. 6A and 6B show plots of a Monte-Carlo mismatch simulation of the relaxation oscillator of FIGS. 4A and 4B with temperature compensation according to various embodiments of the present disclosure.
Figure 6B:
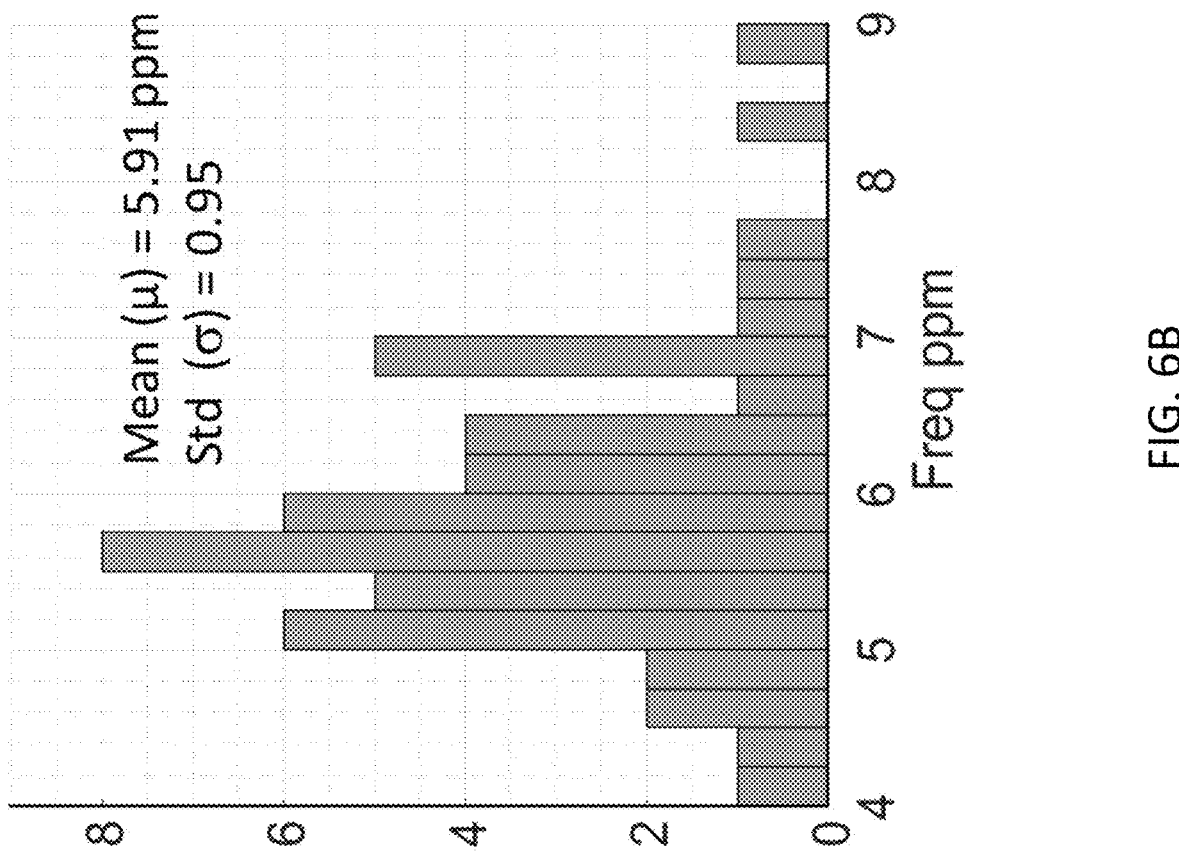

FIG. 5 shows that high stability for an on-chip relaxation oscillator can be achieved when performance is determined by a poly-resistor and mim-capacitor. Additionally, the results of FIG. 5 indicate that the frequency had a complimentary-to-absolute-temperature (CTAT) behavior. This variation may be further improved by incorporating a temperature compensation method. FIG. 4B shows the use of a temperature compensation method that was added to the current sources. The temperature compensation method may introduce a small $2^{nd}$ order current source which may add to the existing PTAT current. This additional current may be provided to an NMOS transistor, such as NMOS transistors 411a,b, and a capacitor, such as capacitors 416, 418. This additional current may directly vary with an operating temperature of an oscillator as described herein. For example, this source may introduce a slightly higher current at higher temperature to compensate for lowering of the frequency at higher temperature. With this compensation technique, the curvature of the frequency variation with temperature may be corrected. FIGS. 6A and 6B show plots of a Monte-Carlo mismatch simulation of the relaxation oscillator of FIGS. 4A and 4B with temperature compensation. In particular, FIGS. 6A and 6B show the simulation result of a 50-point Monte-Carlo mismatch simulation incorporating the $2^{nd}$ order temperature compensation scheme, described herein. FIG. 6A shows the variation of frequency as a function of temperature across the 50 points of the Monte-Carlo Simulation, achieving an operational frequency of 32.7 kHz. FIG. 6B shows a histogram of frequency variation in parts per million (ppm) across 50 points of the Monte-Carlo simulation. The histogram shows that frequency variation of the oscillator design had a mean performance of 5.9 ppm/° C. and a sigma of 1-ppm. All simulation points were below 10 ppm/° C., demonstrating the reported performance for an on-chip oscillator accounting for device mismatch variation.

Figure 7A:
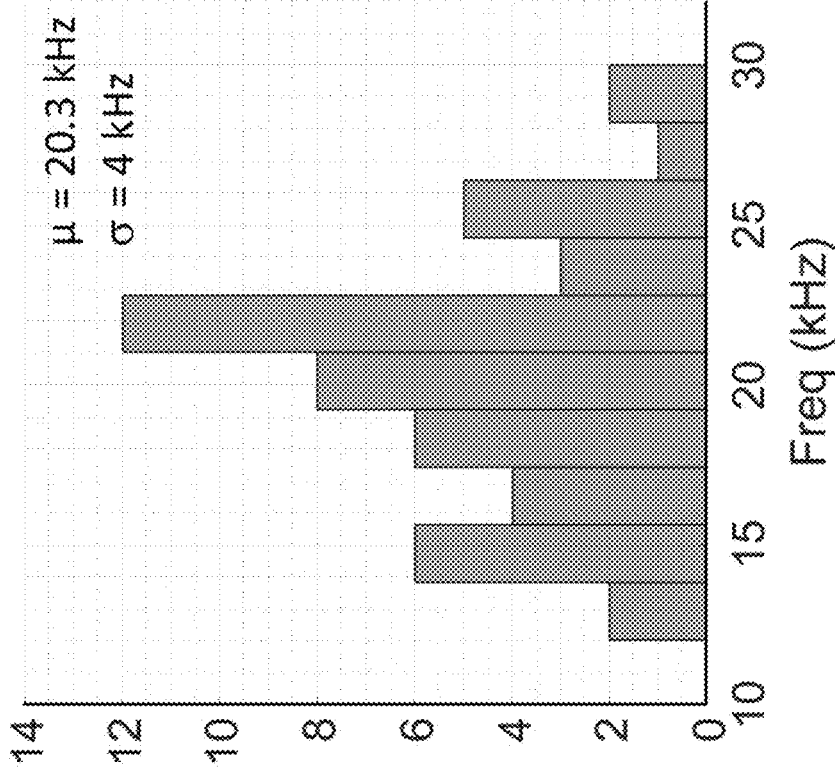
FIGS. 7A and 7B show histograms of the process and temperature variation of the relaxation oscillator of FIGS. 4A and 4B according to various embodiments of the present disclosure.
Figure 7B:
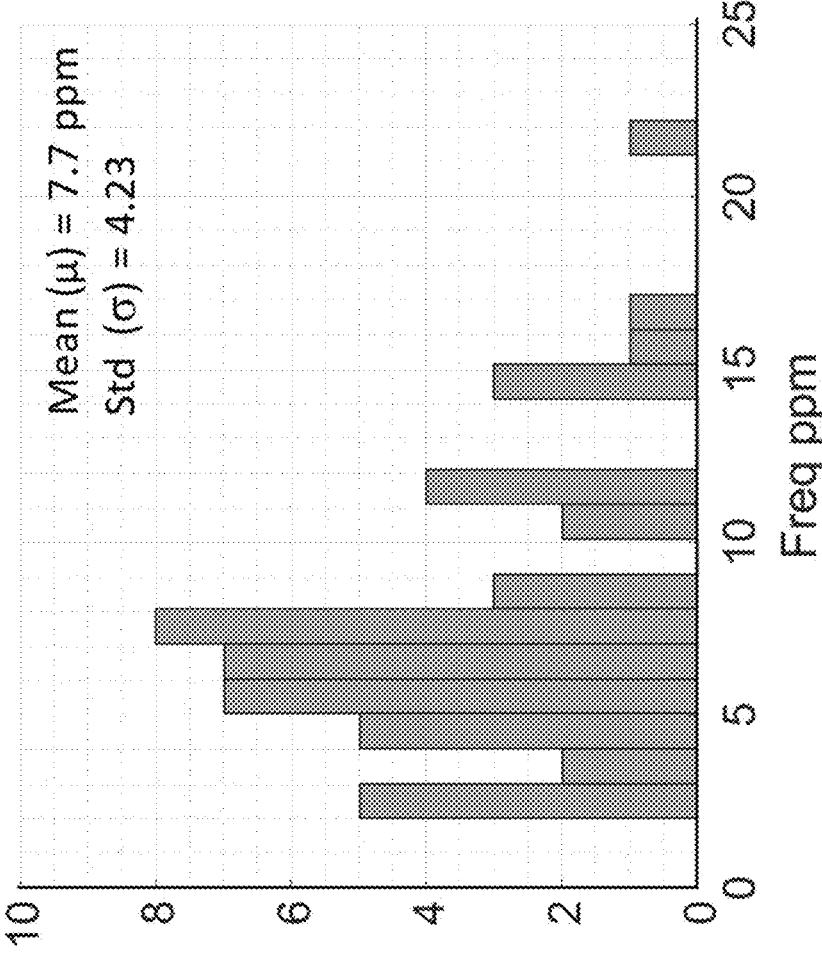

The performance of the relaxation oscillator was further assessed across process variations using a 50-point statistical variation simulation. FIGS. 7A and 7B show histograms of the process and temperature variation of the relaxation oscillator of FIGS. 4A and 4B. FIG. 7A shows a histogram of the frequency variation of the relaxation oscillator with process variation. The simulation showed that the frequency of the relaxation oscillator varied with process changes, with a mean of 20 kHz and a sigma variation of 4 kHz. This frequency variation was attributed to the process variations in the resistors and capacitors used in the oscillator. A process calibration technique may be provided to adjust the oscillation frequency to 32 kHz for real-time applications. FIG. 7B shows a histogram of the relaxation oscillator's frequency stability across temperature variation from –20 to 100° C. Despite frequency variations due to process changes, the frequency remained stable with respect to temperature, indicating the effectiveness of the frequency compensation technique, described herein, across process variations. The maximum ppm variation across process was 22 ppm/° C. A process compensation technique may be provided to address process variation and achieve a more stable frequency operation.

Relaxation Oscillator Analysis and Results

A lowest power, highest efficiency energy harvesting circuit was developed harvesting energy from 10 mV input voltage [6] to maximize the available energy. A lowest voltage, ultra-low power bandgap reference circuit [7] and lowest voltage and high efficiency SIMO DC-DC converter [8] were developed to make use of most of the available energy. Further, a lowest power 32 kHz crystal oscillator with a power consumption of 1.5 nW was developed to minimize the ideal model power consumption in a duty cycled system [9]. A 235 nW wake-up radio running on harvested energy was also developed [5].

A high-stability, ULP, 32 kHz on-chip oscillator for IoT devices was developed, which was based on the design of the relaxation oscillator shown in FIGS. 4A and 4B, and which achieved a temperature stability of less than 5 ppm/° C. with less than 50 nW power consumption for a temperature range of –20° C. to 100° C. The expected power supply variation of the oscillator was around 1 ppm/V. The oscillator was also shown to be very robust across process variation and mismatch across design components.

FIG. 8 is a table showing a comparison of a relaxation oscillator according to various embodiments of the present disclosure with other oscillators. The mean stability of the relaxation oscillator described herein may be less than 6 ppm/° C., with several points below the mean, which is best when compared to the other on-chip oscillators. These results suggest that the frequency of oscillation may vary by 0.17% for a 1V variation which roughly translates to 1 ppm/mV variation. The power consumption of the relaxation oscillator described herein may be less than 50 nW.

As shown in FIG. 8, the average expected frequency stability of the relaxation oscillator described herein exceeded the values in [21] by more than 2-times and nearly an order of magnitude better than the values in [20] and [22]. Additionally, the relaxation oscillator described herein had comparable power supply variation to and significantly better than and [22]. Its power consumption also outperformed [20] and [22]. Although had a lower power consumption of 4.7 nW, it operated at 3 kHz, which was more than 10×lower than a 32.768 RTC clock. The relaxation oscillator described herein may have an area of approximately 0.25 mm². The performance of the relaxation oscillator described herein was not only shown to be better than the other oscillators, but it was also very comparable to a crystal oscillator in terms of performance. An on-chip realization of the relaxation oscillator disclosed herein may replace the use of crystal oscillator, offering significant reductions in both cost and size for IoT devices.

FIG. 9 is a flowchart depicting a method for generating a clock signal according to various embodiments of the present disclosure. At 902, a first bias voltage may be generated by a first bias voltage generation circuit. At 904, a second bias voltage may be generated by a second bias voltage generation circuit. At 906, a first proportional to absolute temperature (PTAT) voltage may be generated by a first capacitor circuit. At 908, a second PTAT voltage may be generated by a second capacitor circuit. At 910, the first bias voltage and the first PTAT voltage may be compared by the first comparator. At 912, a first comparator output signal based on the comparison of the first bias voltage and the first PTAT voltage may be generated by the first comparator. At 914, a second comparator output signal based on the comparison of the second bias voltage and the second PTAT voltage may be generated by the second comparator. The first bias voltage and the second bias voltage may directly vary with thermal voltage. At 918, a clock signal based on the first and the second comparator output signals may be generated by a flip-flop electrically coupled to the first comparator and the second comparator.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the disclosed subject matter is described herein in terms of certain preferred embodiments, those skilled in the art will recognize that various modifications and improvements may be made to the disclosed subject matter without departing from the scope thereof. Moreover, although individual features of one embodiment of the disclosed subject matter may be discussed herein or shown in the drawings of the one embodiment and not in other embodiments, it should be apparent that individual features of one embodiment may be combined with one or more features of another embodiment or features from a plurality of embodiments.

In addition to the specific embodiments claimed below, the disclosed subject matter is also directed to other embodiments having any other possible combination of the dependent features claimed below and those disclosed above. As such, the particular features presented in the dependent claims and disclosed above can be combined with each other in other manners within the scope of the disclosed subject matter such that the disclosed subject matter should be recognized as also specifically directed to other embodiments having any other possible combinations. Thus, the foregoing description of specific embodiments of the disclosed subject matter has been presented for purposes of illustration and description. It is not intended to be exhaustive or to limit the disclosed subject matter to those embodiments disclosed.

It will be apparent to those skilled in the art that various modifications and variations can be made in the method and system of the disclosed subject matter without departing from the spirit or scope of the disclosed subject matter. Thus, it is intended that the disclosed subject matter include modifications and variations that are within the scope of the appended claims and their equivalents.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions. Accordingly, the foregoing description and attached drawings are by way of example only, and are not intended to be limiting.

REFERENCES

Each of the following references is hereby incorporated by reference in its entirety:

[1] Harald Bauer, Mark Patel, and Jan Veira. "*The Internet of Things: Sizing up the opportunity*." www.mckinsey-.com/industries/semiconductors/our-insights/the-internet-of-things-sizing-upthe-opportunity/[2]

[2] N. Shafiee; S. Tewari; B. Calhoun; A. Shrivastava, "*Infrastructure Circuits for Lifetime Improvement of Ultra-Low Power IoT Devices*," in IEEE Transactions on Circuits and Systems I: Regular Papers, vol. PP, no. 99, pp. 1-13 doi: 10.1109/TCSI.2017.2693181

[3] Y. Zhang et al., "*A Batteryless 19 µW MICS ISM-Band Energy Harvesting Body Sensor Node SoC for ExG Applications*," in IEEE Journal of Solid-State Circuits, vol. 48, no. 1, pp. 199-213, January 2013. doi: 10.1109/JSSC.2012.2221217

[4] Y. Chen, M. Cho, S. Jeong, D. Blaauw, D. Sylvester, and H. S. Kim. "*A dual-stage, ultra-low-power acoustic event detection system*." In 2016 IEEE International Workshop on Signal Processing Systems (SiPS), pages 213-218, October 2016.

[5] N. E. Roberts, K. Craig, A. Shrivastava, S. Wooters, Y. Shaksheer, D. Wentzloff, and B. H. Calhoun, "*A 236nW-56.5 dBm Sensitivity Bluetooth Low-Energy Wakeup Receiver with Energy Harvesting in 65 nm CMOS*," IEEE Solid-State Circuits Conference (ISSCC), February 2016

[6] A. Shrivastava, N. E. Roberts, O. U. Khan, D. D. Wentzloff, and B. H. Calhoun, "*A 10 mv-input boost converter with inductor peak current control and zero detection for thermoelectric and solar energy harvesting with 220 mv cold-start and*-14.5 *dbm,* 915 *MHz RF kick-start*," IEEE Journal of Solid-State Circuits, vol. 50, no. 8, pp. 1820-1832 August 2015.

[7] A. Shrivastava, K. Craig, N. E. Roberts, D. D. Wentzloff, and B. H. Calhoun, "*A 32nW bandgap reference voltage operational from 0.5V supply for ultra-low power systems*," in Dig. Tech. Papers Intl. Solid-State Circuits Conf. (ISSCC), February 2015, pp. 94-95.

[8] A. Klinefelter, N. E. Roberts, Y. Shakhsheer, P. Gonzalez, A. Shrivastava, A. Roy, K. Craig, M. Faisal, J. Boley, S. Oh, Y. Zhang, D. Akella, D. Wentzloff, B. H. Calhoun, "*A 6.45 µW self-powered IoT SOC with integrated energy-harvesting power management and ULP asymmetric radios*," in IEEE Intl. Solid-State Circuits Conf. (ISSCC) Dig. Tech. Papers, February 2015.

[9] A. Shrivastava, D. Akella Kamakshi and B. H. Calhoun, "*A 1.5 nW, 32.768 kHz XTAL Oscillator Operational From a 0.3 V Supply*," in IEEE Journal of Solid-State Circuits, vol. 51, no. 3, pp. 686-696, March 2016. doi: 10.1109/JSSC.2015.2512382

[10] G. de Streel et al., "*SleepTalker: A ULV 802.15.4a IR-UWB Transmitter SoC in 28-nm FDSOI Achieving 14 pJ b at 27 Mb s With Channel Selection Based on Adaptive FBB and Digitally Programmable Pulse Shaping*," in IEEE Journal of Solid-State Circuits, vol. 52, no. 4, pp. 1163-1177 April 2017. doi: 10.1109/JSSC.2016.2645607

[11] A. Roy et al., "A 6.45 $mu {rm W} $ Self-Powered SoC With Integrated Energy-Harvesting Power Management and ULP Asymmetric Radios for Portable Biomedical Systems," in IEEE Transactions on Biomedical Circuits and Systems, vol. 9, no. 6, pp. 862-874, December 2015. doi: 10.1109/TBCAS.2015.2498643

[12] K. J. Hsiao, "*A 1.89nW 0.15 V self-charged XO for real-time clock generation*", IEEE Int. Solid-State Circuits Conf., pp. 298-299, February 2014.

[13] D. Yoon, D. Sylvester, D. Blaauw, "*A 5.58nW 32.768 kHz DLL-Assisted XO for real-time clocks in wireless* sensing applications", IEEE Int. Solid-State Circuits Conf. (ISSCC) Dig. Tech. Papers, pp. 366-368, February 2012.

[14] E. Vittoz, M. G. R. Degrauwe, S. Bitz, "High-performance crystal oscillator circuits: Theory and application", IEEE J. Solid-State Circuits, vol. 23, no. 3, pp. 774-783, June

[15] W. Thommen, "An improved low power crystal oscillator", Proc. IEEE Eur. Solid-State Circuits Conf., pp. 146-149, September 1999.

[16] Y. Tokunaga, S. Sakiyama, A. Matsumoto, S. Dosho, "An on-chip CMOS relaxation oscillator with voltage averaging feedback", IEEE J. Solid-State Circuits, vol. 45, no. 6, pp. 1150-1158 June 2010.

[17] Y.-S. Lin, D. Sylvester, D. Blaauw, "A Sub-pW timer using gate leakage for ultra low-power sub-Hz monitoring systems", Proc. IEEE Custom Integr. Circuits Conf., pp. 397-400, September 2007

[18] Y.-S. Lin, D. Sylvester, D. Blaauw, "A 150 pW program-and-hold timer for ultra-low-power sensor platforms", IEEE Int. Solid-State Circuits Conf. (ISSCC) Dig. Tech. Papers, pp. 326-327, February 2009.

[19] Y. Lee, B. Giridhar, Z. Foo, D. Sylvester, D. Blaauw, "A 660 pW multi-stage temperature compensated timer for ultra-low power wireless sensor node synchronization", IEEE Int. Solid-State Circuits Conf. (ISSCC) Dig. Tech. Papers, pp. 46-48, February 2011.

[20] D. Griffith, P. T. Røine, J. Murdock and R. Smith, "17.8 A 190nW 33 kHz RC oscillator with ±0.21% temperature stability and 4 ppm long-term stability," 2014 IEEE International Solid-State Circuits Conference Digest of Technical Papers (ISSCC), San Francisco, CA, 2014, pp. 300-301.

[21] T. Jang, M. Choi, S. Jeong, S. Bang, D. Sylvester and D. Blaauw, "5.8 A 4.7nW 13.8 ppm?? C self-biased wakeup timer using a switched-resistor scheme," 2016 IEEE International Solid-State Circuits Conference (ISSCC), San Francisco, CA, 2016, pp. 102-103. doi: 10.1109/ISSCC.2016.7417927

[22] M. Choi, T. Jang, S. Bang, Y. Shi, D. Blaauw and D. Sylvester, "A 110 nW Resistive Frequency Locked On-Chip Oscillator with 34.3 ppm/° C. Temperature Stability for System-on-Chip Designs," in IEEE Journal of Solid-State Circuits, vol. 51, no. 9, pp. 2106-2118 September 2016 doi: 10.1109/JSSC.2016.2586178

[23] A. Shrivastava, B. H. Calhoun, "A 150nW 5 ppm/° C. 100 kHz on-chip clock source for ultra low power SoCs", Proc. IEEE Custom Integr. Circuits Conf., pp. 1-4, September 2012.

[24] P. M. Nadeau, A. Paidimarri and A. P. Chandrakasan, "Ultra Low-Energy Relaxation Oscillator With 230 fJ/cycle Efficiency," in IEEE Journal of Solid-State Circuits, vol. 51, no. 4, pp. 789-799, April 2016. doi: 10.1109/JSSC.2016.2521886

What is claimed is:

1. An on-chip ultra-low power (ULP) RC oscillator, the on-chip ULP RC oscillator comprising:

a first comparator, wherein the first comparator comprises a first input electrically coupled to a first bias voltage generation circuit and a second input electrically coupled to a first capacitor circuit, the first bias voltage generation circuit being configured to generate a first bias voltage, and the first capacitor circuit being configured to generate a first proportional to absolute temperature (PTAT) voltage, wherein the first comparator is configured to compare the first bias voltage and the first PTAT voltage, and to generate a first comparator output signal based on the comparison;

a second comparator, wherein the second comparator comprises a first input electrically coupled to a second bias voltage generation circuit and a second input electrically coupled to a second capacitor circuit, the second bias voltage generation circuit being configured to generate a second bias voltage, and the second capacitor circuit being configured to generate a second PTAT voltage, wherein the second comparator is configured to compare the second bias voltage and the second PTAT voltage and to generate a second comparator output signal based on the comparison, wherein each of the first bias voltage and the second bias voltage directly varies with a thermal voltage; and a flip-flop electrically coupled to the first comparator and the second comparator, wherein:

the flip-flop is configured to generate a clock signal based on the first and the second comparator output signals, the flip-flop is an RS flip-flop, the flip-flop is electrically coupled to the first comparator and the second comparator, a first input of the flip-flop is configured to receive the first comparator output signal, a second input of the flip-flop is configured to receive the second comparator output signal, a first output of the flip-flop is configured to provide a first offset correction to the first comparator, and a second output of the flip-flop is configured to provide a second offset correction to the second comparator.

2. The on-chip ULP RC oscillator of claim 1, wherein the first and the second bias voltage generation circuits each comprise a proportional to absolute temperature (PTAT) current source electrically coupled in series with a resistor, wherein the PTAT current source is configured to produce a current and provide the current to the resistor.

3. The on-chip ULP RC oscillator of claim 2, wherein the PTAT current source is biased sub-threshold.

4. The on-chip ULP RC oscillator of claim 2, wherein the PTAT current source is configured to produce a current that is proportional to the thermal voltage.

5. The on-chip ULP RC oscillator of claim 2, wherein the resistor comprises a poly-resistor, and wherein the resistor is characterized by a bias resistance, $R_B$.

6. The on-chip ULP RC oscillator of claim 1, wherein the first and the second capacitor circuits each comprise a proportional to absolute temperature (PTAT) current source electrically coupled in series to an NMOS transistor, a capacitor, and a temperature compensation circuit, and wherein the PTAT current source is configured to produce a current and provide the current to the NMOS transistor and the capacitor.

7. The on-chip ULP RC oscillator of claim 6, wherein the PTAT current source is biased sub-threshold.

8. The on-chip ULP RC oscillator of claim 6, wherein the PTAT current source is configured to produce a current that is proportional to the thermal voltage.

9. The on-chip ULP RC oscillator of claim 6, wherein the NMOS transistor is electrically coupled at its source to the capacitor, and the NMOS transistor is electrically coupled at its gate to the flip-flop.

10. The on-chip ULP RC oscillator of claim 6, wherein the capacitor is a Metal-Insulator-Metal (MIM) capacitor.

11. The on-chip ULP RC oscillator of claim 1, wherein the thermal voltage varies with an operating temperature of the on-chip ULP RC oscillator.

12. The on-chip ULP RC oscillator of claim 1, wherein the RS flip-flop is electrically coupled to the first capacitor circuit and the second capacitor circuit, wherein the first output of the RS flip-flop is configured to drive the second capacitor circuit, and wherein the second output of the RS flip-flop is configured to drive the first capacitor circuit.

13. An on-chip ULP RC oscillator, the on-chip ULP RC oscillator comprising:

a first comparator, wherein the first comparator comprises a first input electrically coupled to a first bias voltage generation circuit and a second input electrically coupled to a first capacitor circuit, the first bias voltage generation circuit being configured to generate a first bias voltage, and the first capacitor circuit being configured to generate a first proportional to absolute temperature (PTAT) voltage, wherein the first comparator is configured to compare the first bias voltage and the first PTAT voltage, and to generate a first comparator output signal based on the comparison;

a second comparator, wherein the second comparator comprises a first input electrically coupled to a second bias voltage generation circuit and a second input electrically coupled to a second capacitor circuit, the second bias voltage generation circuit being configured to generate a second bias voltage, and the second capacitor circuit being configured to generate a second PTAT voltage, wherein the second comparator is configured to compare the second bias voltage and the second PTAT voltage and to generate a second comparator output signal based on the comparison, wherein each of the first bias voltage and the second bias voltage directly varies with a thermal voltage; and a flip-flop electrically coupled to the first comparator and the second comparator, wherein:

the flip-flop is configured to generate a clock signal based on the first and the second comparator output signals, the first and the second bias voltage generation circuits each comprise a proportional to absolute temperature (PTAT) current source electrically coupled in series with a resistor, the PTAT current source being configured to produce a current and provide the current to the resistor, the PTAT current source comprises a plurality of PMOS transistors and a plurality of NMOS transistors, the current is characterized by $nV_t \ln(M)/R_B$, and $V_t$ is the thermal voltage, M is a beta parameter of one of the plurality of PMOS transistors, $R_B$ is a bias resistance, and n is a scaling factor.

14. An on-chip (ULP) RC oscillator, the on-chip ULP RC oscillator comprising:

a first comparator, wherein the first comparator comprises a first input electrically coupled to a first bias voltage generation circuit and a second input electrically coupled to a first capacitor circuit, the first bias voltage generation circuit being configured to generate a first bias voltage, and the first capacitor circuit being configured to generate a first proportional to absolute temperature (PTAT) voltage, wherein the first comparator is configured to compare the first bias voltage and the first PTAT voltage, and to generate a first comparator output signal based on the comparison;

a second comparator, wherein the second comparator comprises a first input electrically coupled to a second bias voltage generation circuit and a second input electrically coupled to a second capacitor circuit, the second bias voltage generation circuit being configured to generate a second bias voltage, and the second capacitor circuit being configured to generate a second PTAT voltage, wherein the second comparator is configured to compare the second bias voltage and the second PTAT voltage and to generate a second comparator output signal based on the comparison, wherein each of the first bias voltage and the second bias voltage directly varies with a thermal voltage; and a flip-flop electrically coupled to the first comparator and the second comparator, wherein:

the flip-flop is configured to generate a clock signal based on the first and the second comparator output signals, the first and the second capacitor circuits each comprise a proportional to absolute temperature (PTAT) current source electrically coupled in series to an NMOS transistor, a capacitor, and a temperature compensation circuit, the PTAT current source is configured to produce a current and provide the current to the NMOS transistor and the capacitor, the temperature compensation circuit comprises a second order current source, and the second order current source is configured to produce an additional current and provide the additional current to the NMOS transistor and the capacitor.

15. The on-chip ULP RC oscillator of claim 14, wherein the additional current directly varies with an operating temperature of the on-chip ULP RC oscillator.

16. The on-chip ULP RC oscillator of claim 14, wherein the clock signal comprises a frequency stability of about 5.9 ppm/° C.

17. A method of generating a clock signal, the method comprising:

generating, by a first bias voltage generation circuit, a first bias voltage;

generating, by a second bias voltage generation circuit, a second bias voltage;

generating, by a first capacitor circuit, a first proportional to absolute temperature (PTAT) voltage;

generating, by a second capacitor circuit, a second PTAT voltage;

comparing, by a first comparator, the first bias voltage and the first PTAT voltage;

generating, by the first comparator, a first comparator output signal based on the comparison of the first bias voltage and the first PTAT voltage;

comparing, by a second comparator, the second bias voltage and the second PTAT voltage;

generating, by the second comparator, a second comparator output signal based on the comparison of the second bias voltage and the second PTAT voltage, wherein each of the first bias voltage and the second bias voltage directly varies with a thermal voltage;

generating, by an RS flip-flop electrically coupled to the first comparator and the second comparator, a clock signal based on the first and the second comparator output signals;

receiving, by a first input of the RS flip-flop, the first comparator output signal;

receiving, by a second input of the RS flip-flop, the second comparator output signal;

providing, by a first output of the RS flip-flop, a first offset correction to the first comparator; and providing, by a second output of the RS flip-flop, a second offset correction to the second comparator.

18. The method of claim 17, wherein the first and the second bias voltage generation circuits each comprise a proportional to absolute temperature (PTAT) current source electrically coupled in series with a resistor; and wherein the method further comprises:

producing, by the PTAT current source, a current; and providing, by the PTAT current source, the current to a resistor, wherein the first and the second bias voltage generation circuits each comprise a proportional to absolute temperature (PTAT) current source electrically coupled in series with a resistor.

19. The method of claim 18, wherein the PTAT current source is biased sub-threshold.

20. The method of claim 18, further comprising producing, by the PTAT current source, a current that is proportional to the thermal voltage.

21. The method of claim 18, wherein the PTAT current source comprises a plurality of PMOS transistors and a plurality of NMOS transistors, wherein the current is characterized by $nV_t \ln(M)/R_B$, and wherein $V_t$ is the thermal voltage, M is a beta parameter of one of the plurality of PMOS transistors, $R_B$ is a bias resistance, and n is a scaling factor.

22. The method of claim 18, wherein the resistor comprises a poly-resistor, and wherein the resistor is characterized by a bias resistance, $R_B$.

23. The method of claim 17, wherein the first and the second capacitor circuits each comprise a proportional to absolute temperature (PTAT) current source electrically coupled in series to an NMOS transistor, a capacitor, and a temperature compensation circuit; and wherein the method further comprises:

producing, by the PTAT current source, a current, and providing, by the PTAT current source, the current to the NMOS transistor and the capacitor.

24. The method of claim 23, wherein the PTAT current source is biased sub-threshold.

25. The method of claim 23, further comprising producing, by the PTAT current source, a current that is proportional to the thermal voltage.

26. The method of claim 23, wherein the NMOS transistor is electrically coupled at its source to the capacitor, and the NMOS transistor is electrically coupled at its gate to the flip-flop.

27. The method of claim 23, wherein the capacitor is a Metal-Insulator-Metal (MIM) capacitor.

28. The method of claim 23, wherein the temperature compensation circuit comprises a second order current source; and wherein the method further comprises:

producing, by the second order current source, an additional current, and providing, by the second order current source, the additional current to the NMOS transistor and the capacitor.

29. The method of claim 28, wherein the additional current directly varies with an operating temperature.

30. The method of claim 28, wherein the clock signal comprises a frequency stability of about 5.9 ppm/° C.

31. The method of claim 17, wherein the thermal voltage varies with an operating temperature.

32. The method of claim 17, wherein the RS flip-flop is electrically coupled to the first capacitor circuit and the second capacitor circuit; and wherein the method further comprises:

driving, by a first output of the RS flip-flop, the second capacitor circuit; and driving, by a second output of the RS flip-flop, the first capacitor circuit.

* * * * *